310-322

SR

OR 4,006,371

United States Patent [19]

Quirke

[11] 4,006,371

[45] Feb. 1, 1977

[54] ELECTROACOUSTICAL TRANSDUCER COMPRISING PIEZOELECTRIC ELEMENT

[75] Inventor: Patric C. Quirke, Whitewater, Wis.

[73] Assignee: Whitewater Electronics, Inc., Whitewater, Wis.

[22] Filed: Mar. 20, 1975

[21] Appl. No.: 560,487

Related U.S. Application Data

[63] Continuation of Ser. No. 342,751, March 19, 1973.

[52] U.S. Cl. .......... 310/8.2

[51] Int. Cl.² .......... H01L 41/08

[58] Field of Search .......... 310/8.2, 8.3, 8.5, 8.6, 310/9.1; 179/110 A, 110 R, 179

[56] References Cited

UNITED STATES PATENTS

| | | | |
|---|---|---|---|
| 2,967,957 | 1/1961 | Massa | 310/8.3 X |
| 3,331,970 | 7/1967 | Dundon et al. | 310/8.2 X |
| 3,651,286 | 3/1972 | Gorike et al. | 179/179 X |
| 3,700,938 | 10/1972 | Bryant | 310/8.2 X |
| 3,708,702 | 1/1973 | Brunnert et al. | 310/8.2 |
| 3,746,898 | 7/1973 | Austin et al. | 310/8.2 X |
| 3,749,854 | 7/1973 | Mifune et al. | 310/8.6 X |
| 3,819,879 | 6/1974 | Baechtold | 179/179 |
| 3,860,838 | 1/1975 | Kumon | 310/8.5 |
| 3,872,470 | 3/1975 | Hoerz et al. | 310/8.2 X |

OTHER PUBLICATIONS

McGraw Hill Dictionary of Technical & Scientific Terms, p. 678.

*Primary Examiner*—Mark O. Budd
*Attorney, Agent, or Firm*—Ira Milton Jones & Associates

[57] ABSTRACT

An electroacoustical transducer element comprises a piezoelectric disc flatwise bonded to a metal diaphragm, the bond being at the plane of neutral stress. The transducer element defines the front wall of a sealed chamber that serves as an infinite baffle. In front of the element is a resonant acoustical cavity that matches impedance of the element to that of the ambient medium and comprises concentric axially short large and small diameter cylindrical chamber portions, the small diameter portion providing a front outlet from the large diameter one.

3 Claims, 4 Drawing Figures

ELECTROACOUSTICAL TRANSDUCER COMPRISING PIEZOELECTRIC ELEMENT

This application is a continuation of my copending application, Ser. No. 342,751, filed Mar. 19, 1973.

This invention relates to electroacoustical transducers and is more particularly concerned with a transducer in which the transducer element comprises a piezoelectric driver, and which is rather sharply selective to a particular frequency and is substantially nondirectional.

It is well known that piezoelectric acoustical transducers have heretofore been relatively inefficient because of an inherent mismatch between the acoustic impedance of the transducer element of such a transducer and the impedance of the medium in which the device is intended to operate. Specifically, a transducer element comprising a piezoelectric disc bonded to a metal diaphragm tends to have a very high acoustic impedance. Air, by comparison, has a very low acoustic impedance. If the transducer is intended to operate in water, as where it comprises part of a sonar device, the problem of impedance mismatch is less severe, owing to the fact that water has a characteristic acoustic impedance substantially higher than that of air, but it is still a problem because even the acoustic impedance of water is substantially lower than the acoustic impedance of a piezoelectric element. This problem of impedance mismatch with respect to air is discussed in U.S. Pat. No. 3,331,970, to Dundon et al.

A typical application for a narrow frequency range piezoelectric sonic transducer operating in air is its use for an audible alarm. Since the human ear is most sensitive to frequencies on the order of 2,000 to 4,000 Hz, the alarm transducer preferably emits a tone within that frequency range. However, it is also important that such an alarm device shall emit sound substantially nondirectionally, to afford the greatest likelihood that it will be heard by someone when it operates.

Heretofore the usual expedient for achieving some degree of impedance matching between a piezoelectric transducer and air has been to place the transducer element at one end of a tube having a length of about one-fourth the wavelength at the operating frequency. As pointed out in the above mentioned U.S. Pat. No. 3,331,970, such a quarter-wave resonance tube left much to be desired from the standpoint of impedance matching, and it has the further important disadvantages of being bulky and tending to be directional.

For a frequency on the order of 4,000 Hz, a quarter wave tube about one inch in diameter must have a length of about one-half inch, and must be longer if its diameter is decreased. The size of such a tube would probably have been tolerable, in many installations, but the directionality that it imparted to the device if its length was kept within feasible limits was not acceptable in an audible alarm device, and certainly was not compensated for by the relatively small amount of impedance matching obtained with it.

The great importance of obtaining good impedance matching in an audible alarm system can be appreciated if some consideration is given to the purpose that such a system may serve. In a typical installation an audible alarm unit is connected with a temperature sensor in a freezer. In the event of any failure that causes the temperature in the freezer to rise to some predetermined level, the alarm should sound. But because the alarm may be sounded by reason of a power failure, the alarm system obviously cannot depend upon the power wiring for its current supply, and must therefore be energized from a battery. However, the battery should be a relatively small one (e.g., a conventional 9-volt transistor radio battery), to keep its cost low enough so that there will be no discouragement to replacing it whenever its shelf life is near expiration. On the other hand, the battery must be capable of energizing the transducer for a prolonged period, so that if the freezer should fail during the early part of a several-day period during which the persons to be alerted are absent, the alarm will still be sounding when they return. Such long-term operation can be obtained with a small battery only if the transducer that it energizes is a highly efficient one; and in turn this requirement for high efficiency can be satisfied only if there is a good impedance match between the transducer element and the ambient atmosphere.

With these considerations in mind, it is a general object of the present invention to provide a piezoelectric acoustical transducer that is sharply selective to a narrow frequency range, is substantially nondirectional, is very compact, and is highly efficient.

Thus it can be said to be an object of this invention to provide an acoustical transducer that is especially well adapted for use in an audible alarm system in which the transducer must be capable of being satisfactorily energized from a small battery for a prolonged period of time, must be audible from substantially any direction, and must emit a tone that is within the frequency range to which the ear is most sensitive so that the alarm can be heard at the greatest possible distance with the least expenditure of energy.

It is also a general object of this invention to provide an alarm transducer of the character described that is extremely simple, compact, dependable and inexpensive.

Since an electroacoustical transducer can either transform electrical energy into sound energy (acting as a speaker) or sound energy into electrical energy (acting as a microphone) it can also be said to be an object of this invention to provide a crystal microphone or sonic detector which is unusually sensitive and substantially nondirectional but which, however, is sharply peaked to a selected frequency.

A more specific object of this invention is to provide means for achieving a well matched acoustic coupling between a transducer element — and especially one comprising a piezoelectric disc bonded to a diaphragm — and the medium in which the transducer element is operating.

It is also a specific object of this invention to provide an electroacoustical transducer having a transducer element which is electro-mechanically efficient and having compact means for closely matching the acoustic impedance of the transducer element to that of the ambient medium in which the element operates.

With these observations and objectives in mind, the manner in which the invention achieves its purpose will be appreciated from the following description and the accompanying drawings, which exemplify the invention, it being understood that changes may be made in the specific apparatus disclosed herein without departing from the essentials of the invention set forth in the appended claims.

The accompanying drawings illustrate one complete example of an embodiment of the invention constructed according to the best mode so far devised for the practical application of the principles thereof, and in which.

Figure 1:
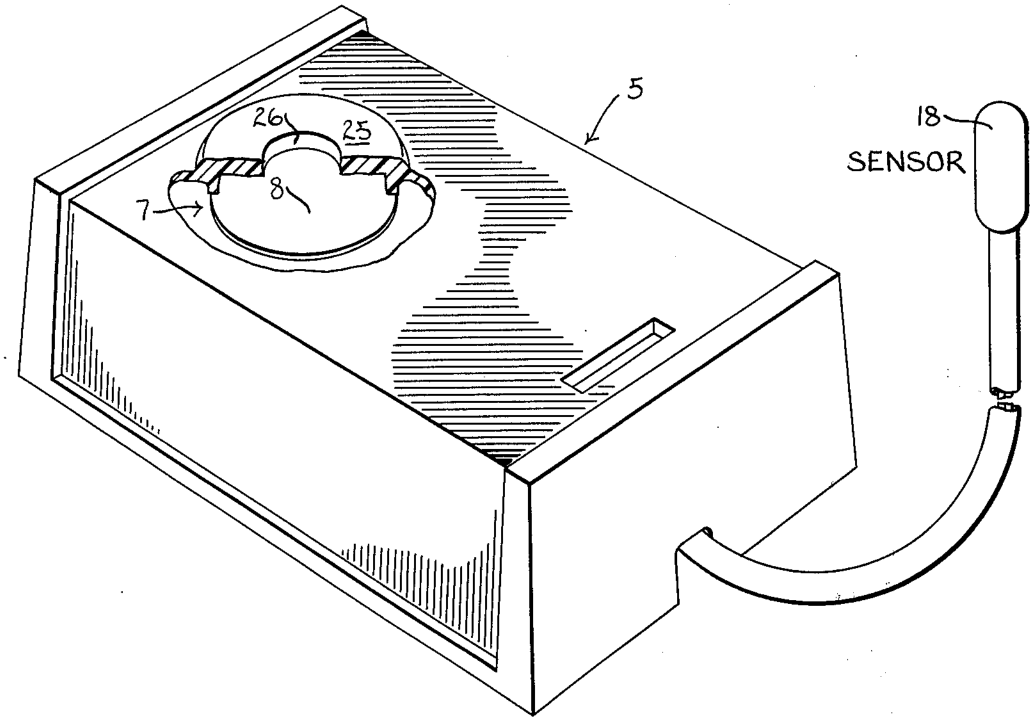
FIG. 1 is a perspective view, with portions shown broken away, of an audible alarm device comprising an electroacoustical transducer embodying the principles of this invention.
Figure 2:
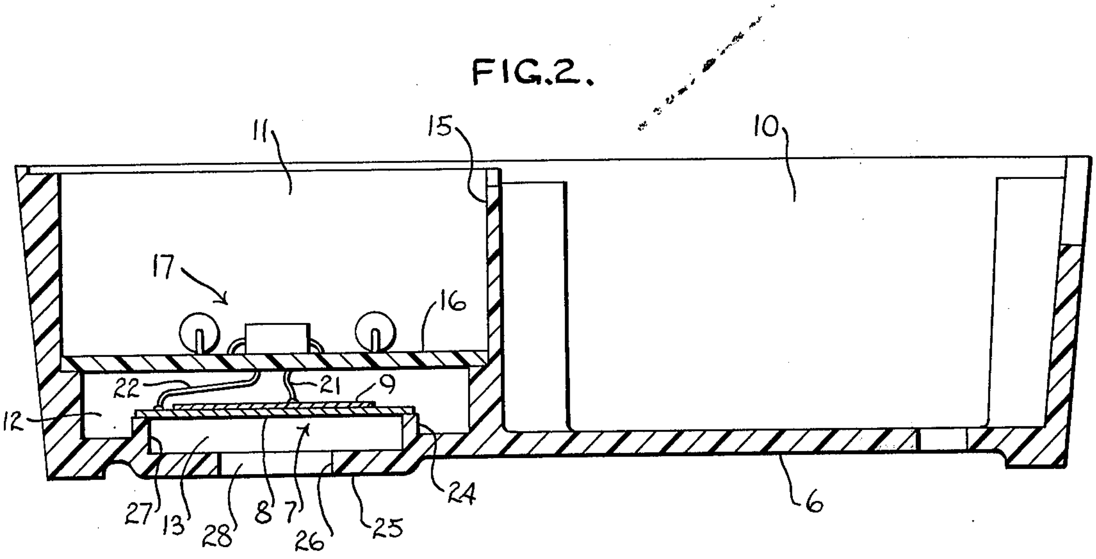
FIG. 2 is a view in cross-section of the device, but with the battery and its connectors omitted.

Referring now to the accompanying drawings, the numeral 5 designates generally an audible alarm device embodying the principles of this invention, comprising a case or housing 6 of high-impact plastic or the like, preferably in the general form of a shallow rectangular box. Mounted in the housing is a disc-like transducer element 7 which comprises, in general, a metal diaphragm 8 and a piezoelectric driver 9, and which is described in detail hereinafter.

The interior of the housing is divided into three compartments 10, 11 and 12, and, in addition, the housing defines a resonant acoustic cavity 13.

The largest of the three compartments in the housing, which is designated by 10, is adapted to hold a battery (not shown) that provides an energy source for the device. The battery compartment 10 has means for releasably securing the battery in it and for making detachable electrical connections to the battery; but these features are not illustrated because they are conventional and well known.

An integral partition wall 15 extending across the housing separates the battery compartment 10 from the other two compartments 11 and 12. The last mentioned compartments are preferably circular in shape and concentric with one another, and they have their axis extending in the direction of the smallest dimension of the housing. The compartment 11, which is at the rear of the housing, houses electronic components 17 comprising an oscillator by which direct current from the battery is converted into a.c. at the resonant frequency of the transducer, for energizing the driver 7 of the transducer. The rear compartment 11 is separated from the compartment 12 by a disc-like printed circuit board 16 on which the oscillator components 17 are mounted. The oscillator circuit is not illustrated because such circuits are well known and are described in such textbooks as "The Radio Amateur's Handbook."

It will be understood that the battery is connectable with the oscillator circuit through any suitable sensor 18 when the transducer is installed in an alarm system, or through a manually or mechanically operated switch (not shown) when the device is incorporated in other audible signalling installations.

The compartment 12 in front of the printed circuit board is defined in part by the transducer element 7, which comprises a front wall portion of that compartment. Both the transducer element and the printed circuit board are sealed to the housing, and therefore the compartment 12 is a closed chamber which adds stiffness to the transducer element and causes a slight increase in its resonant frequency. However, the main function of the chamber 12 is to serve as an infinite baffle that prevents the transmission of sound vibrations from the rear face of the transducer element that would tend to cancel those generated at its front face.

The transducer element is so designed that it has a predetermined natural frequency of vibration in the edge clamped mode and has the bond between its components (piezoelectric driver and diaphragm) in a plane of neutral stress. Therefore the parameters of the diaphragm and piezoelectric driver are so chosen as to insure that the driver will have those characteristics.

Some of the principles involved in so designing a composite unit comprising a piezoelectric element and a metal member bonded to a surface thereof as to cause the composite unit to have neutral stress at the interface are disclosed in U.S. Pat. No. 3,539,952, to H. P. Boettcher et al. However, that patent is concerned with beam-like units, and has been found to be incomplete in its teachings even for such units. The design of an edge-clamped disc unit is more complicated than the design of a beam-like unit and therefore is by no means evident from the teachings of the Boettcher patent.

The equation for simple harmonic motion of a circular plate or disc that is clamped around its edge and is of radius $a$ is:

$$Vmn = \frac{\pi h}{2a^2} \sqrt{\frac{Y}{3p\,(1 - S^2)}}\ (Bmn)^2$$

where $m$, $n$ are integers denoting the modes of motion;
$h$ is the half-thickness of the member;
$p$ is density of the disc material;
$S$ is Poisson's ratio (strain radially to strain axially);
$Y$ is the modulus of elasticity; and
$B$ is the mechanical susceptance in seconds per gram (in the fundamental mode, $B_{01} = 1.015$).

It follows that for the fundamental mode ($B_{01} = 1.015$) of an edge clamped disc having thickness t and diameter d the fundamental frequency is given by $$f_0 = \frac{3.74\,t}{d^2} \sqrt{\frac{Y}{p\,(1 - S^2)}}$$

If the fundamental frequency $f_0$ of the diaphragm is equated to that of the piezoelectric driver, and each component of the composite element has a diameter sufficiently large in proportion to its thickness to insure that the element will vibrate only in the flexure mode (as distinguished from the thickness mode), then for the neutral stress plane to be at the interface:

$$\frac{t_3}{d_2^2} \sqrt{\frac{Y_3}{p_3\,(1 - S_3^2)}} = \frac{t_4}{d_4^2} \sqrt{\frac{Y_4}{p_4\,(1 - S_4^2)}}$$

and $$\frac{Y_3}{t_3^2 p_3} = \frac{Y_4}{t_4^2 p_4}$$

where the subscript 3 denotes diaphragm parameters, the subscript 4 denotes piezoelectric disc parameters and $d_2$ is the effective diameter of the diaphragm. The effective circumference of the diaphragm $d_2$ should be at least equal to the wavelength of the generated frequency in the medium for which the transducer is intended.

With the above defined constraints, the resonant frequency of the transducer element in the edge-clamped mode of vibration is:

$$f_c = \frac{3.74 t_4}{(k + d_4)^2} \sqrt{\frac{Y_4}{p_4 (1 - S_4^2)}}$$

where $k$ is a correction factor:

$$k = (d_2 - d_4) \left(\frac{d_4}{d_2}\right)$$

It will be understood that because the piezoelectric driver is energized with a.c. at a frequency corresponding to that of the fundamental mode of each of the components of the transducer element, only the fundamental mode frequency need be taken into account in the foregoing equations.

The piezoelectric driver normally has both of its surfaces silvered as at 20 to provide electrodes. A wire lead 21 is soldered to the silver coating on the rear face of the piezoelectric disc and another wire lead 22 is soldered to the rear face of the diaphragm, in radially spaced relation to the disc. Any suitable cement can be used for bonding the piezoelectric disc and the diaphragm to one another in intimate flatwise relationship. The thickness of the layer of bonding material should be as small as possible so that such material is substantially confined to the plane of neutral stress.

The shape and proportioning of the resonant acoustic cavity 13 in front of the transducer element are of great importance inasmuch as that cavity serves as the coupling between the transducer element and the ambient sound transmitting medium and insures that sound will be emitted from the transducer as from a point source, that is, without substantial directionality.

In general the resonant acoustic cavity comprises an axially short cylindrical rear chamber 27, defined by a cylindrical inner surface 24 of a wall portion of the housing and having the transducer element as its rear wall, and a coaxial smaller diameter cylindrical front chamber 28, also axially short, into which the rear chamber 27 opens and which is itself open at its front to the ambient medium. Considered another way, the resonant cavity can be regarded as a cylindrical chamber 27 having the transducer element as its rear wall and having at its front a radially inwardly projecting annular flange 25, the opening 26 in which provides an axially short outlet passage from the cylindrical chamber 27.

The transducer element is secured all around its edge, as by means of a suitable cement, to a circumferential rearwardly facing shoulder 29 on the housing wall 24, which shoulder can also define a wall portion of the sealed chamber 12. The transduce element is of course fastened to the housing in coaxial relation to the resonant cavity, and it will be noted that the diameter of the cylindrical rear chamber portion 27 of the resonant cavity defines the effective diameter $d_2$ of the diaphragm.

The resonant frequency $f$ of the acoustic chamber is:

$$f = \frac{c d_1}{2\pi d_2} \sqrt{\frac{1}{t_2 \left(t_1 + \sqrt{\frac{d_1^2}{1.5}}\right)}}$$

where:

$d_1$ is the diameter of the smaller diameter cylindrical cham ber portion, i.e., the opening 26 in the flange-like wall portion, $d_2$ is the inside diameter of the cylindrical rear chamber 27 (equal to the effective diameter of the driver), $t_1$ is the thickness of the flange-like wall portion 25; and $t_2$ is the axial depth of the rear cylindrical chamber portion (i.e., the distance from the transducer element to the flange-like wall).

Figure 3:
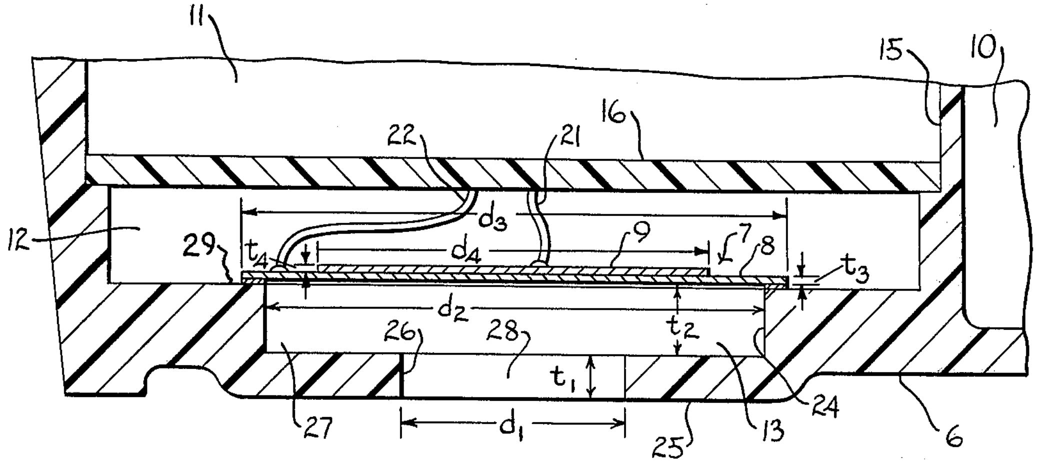
FIG. 3 is an enlarged view generally similar to FIG. 2 but showing only the part of the device that constitutes the transducer and illustrating significant dimensions.
Figure 4:
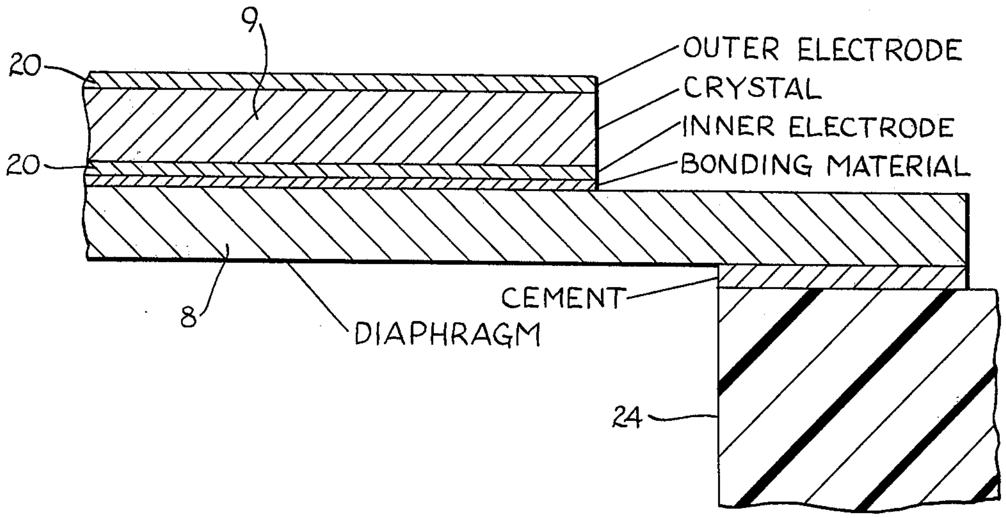
FIG. 4 is a greatly enlarged fragmentary axial section through the transducer element, with certain thicknesses exaggerated for clarity.

(FIG. 3 illustrates the meanings of these parameters.)

It will be recognized that the resonant acoustic cavity of the transducer of this invention is somewhat analogous to a Helmoltz resonator with respect to the parameters which establish its resonant frequency, but that it differs significantly from a Helmholtz resonator in that the latter is excited at its mouth or outlet end whereas the resonant cavity in the transducer of this invention is excited at a rear or inner wall which comprises the transducer element. The analogy is significant, however, because the formula for the resonant frequency of a Helmholtz resonator is directly applicable to the design of an impedance matching acoustic cavity for a transducer of this invention.

From the foregoing description taken with the accompanying drawings it will be apparent that this invention provides an electroacoustical transducer having a piezoelectric driver, which transducer has unusually high efficiency due to the close match attained by the invention between the acoustical impedance of the piezoelectric element and that of the medium in which the transducer is adapted to operate.

Those skilled in the art will appreciate that the invention can be embodied in forms other than as herein disclosed for purposes of illustration.

The invention is defined by the following claims.

I claim:

1. An acoustic transducer that is substantially nondirectional and is adapted for response at substantially a predetermined frequency, said transducer being characterized by:

A. a transducer element comprising a disc of piezoelectric material intimately bonded to a concentric diaphragm; and B. housing means to which the transducer element is bonded all around its edge and which cooperates with the transducer element to define a resonant acoustical cavity of which the transducer element comprises a rear wall, said housing means providing 1. an axially short rear cylindrical chamber concentric to the transducer element and having a diameter on the order of that of the transducer element, and 2. a smaller diameter front cylindrical chamber concentric to the rear cylindrical chamber and which opens unobstructedly at its rear end to the rear cylindrical chamber and at its front end to ambient medium; and C. said housing means being dimensioned substantially in the relationship $$f=\frac{cd_1}{2\pi d_2}\sqrt{\frac{1}{t_2\left(t_1+\sqrt{\frac{d_1^2}{1.5}}\right)}}$$

where $f$ is said predetermined frequency in Hz, $c$ is the velocity of sound in the medium in which the transducer is adapted to operate, $d_1$ is the diameter of the front cylindrical chamber, $d_2$ is the diameter of the rear cylindrical chamber, $t_1$ is the axial dimension of the front cylindrical chamber, and $t_2$ is the axial dimension of the rear cylndrical chamber.

2. An acoustical transducer that is substantially non-directional and is adapted for response at a predetermined frequency, said transducer being characterized by:

A. a transducer element having a predetermined fundamental frequency in the edge-clamped mode and comprising 1. a disc of piezoelectric material having a diameter substantially larger than its thickness,
2. a diaphragm having a diameter at least equal to that of the disc, and
3. means providing a face-to-face bond between the diaphragm and the disc by which they are maintained coaxial;

B. means defining a resonant acoustic cavity of which the transducer element comprises a rear wall, the last mentioned means comprising a housing having portions that define concentric front and rear cylindrical inner surfaces, the rear cylindrical inner surface having a substantially larger diameter than the front one and terminating at its rear end at a radially outwardly projecting rearwardly facing circumferential shoulder to which the diaphragm of the transducer element is concentrically secured all around said shoulder, there being a substantially flat, annular rearwardly facing surface extending radially between the front end of the rear cylindrical inner surface and the rear end of the front one; and C. the dimensions of said acoustic cavity being substantially in the relationship $$f=\frac{cd_1}{2\pi d_2}\sqrt{\frac{1}{t_2\left(t_1+\sqrt{\frac{d_1^2}{1.5}}\right)}}$$

where $f$ is the natural fundamental frequency in Hz of the transducer element, $c$ is the velocity of sound in the medium in which the transducer is intended to operate, $d_1$ is the diameter of the front cylindrical inner surface, $d_2$ is the diameter of the rear cylindrical inner surface, $t_1$ is the axial length of the front cylindrical inner surface, and $t_2$ is the axial distance between the transducer element and said flat annular surface.

3. The transducer of claim 2, further characterized by:

said housing having further portions cooperating with the transducer element to define a closed chamber at the side of the transducer element opposite said resonant acoustic cavity.

* * * * *